US012720770B2

(12) United States Patent
Park

(10) Patent No.: US 12,720,770 B2
(45) Date of Patent: Aug. 25, 2026

(54) SEMICONDUCTOR PACKAGE

(71) Applicant: Samsung Electronics Co., Ltd., Suwon-si (KR)

(72) Inventor: Yongjin Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 497 days.

(21) Appl. No.: 18/207,475

(22) Filed: Jun. 8, 2023

(65) Prior Publication Data

US 2023/0402424 A1 Dec. 14, 2023

(30) Foreign Application Priority Data

Jun. 9, 2022 (KR) ........................ 10-2022-0070165

(51) Int. Cl.

*H10B 80/00* (2026.01)
*H10W 72/00* (2026.01)
*H10W 72/20* (2026.01)
*H10W 72/30* (2026.01)
*H10W 72/90* (2026.01)

(Continued)

(52) U.S. Cl.

CPC ............ *H10B 80/00* (2023.02); *H10W 74/01* (2026.01); *H10W 90/00* (2026.01); *H10W 72/07232* (2026.01); *H10W 72/07236* (2026.01); *H10W 72/07253* (2026.01); *H10W 72/07332* (2026.01); *H10W 72/234* (2026.01); *H10W 72/252* (2026.01); *H10W 72/381* (2026.01); *H10W 72/931* (2026.01); *H10W 72/932* (2026.01); *H10W 72/942* (2026.01); *H10W 72/944* (2026.01); *H10W 72/9445* (2026.01); *H10W 72/952* (2026.01); *H10W 74/15* (2026.01); *H10W 90/722* (2026.01); *H10W 90/724* (2026.01); *H10W 90/732* (2026.01); *H10W 99/00* (2026.01)

(58) Field of Classification Search

CPC ............................... H01L 24/73; H10W 74/01
See application file for complete search history.

(56) References Cited

U.S. PATENT DOCUMENTS 6,323,542 B1 11/2001 Hashimoto
9,947,623 B1 4/2018 Do et al.

(Continued)

FOREIGN PATENT DOCUMENTS

CN 113871369 A 12/2021
KR 101052366 B1 7/2011

(Continued)

*Primary Examiner* — William A Harriston
(74) *Attorney, Agent, or Firm* — Muir Patent Law, PLLC

(57) ABSTRACT

A semiconductor package includes: a base chip including a substrate, an upper protective layer disposed on the substrate, an upper pad disposed on the upper protective layer, and a groove disposed adjacent to the upper pad and in which the upper protective layer is recessed; a semiconductor chip including a connection pad disposed on the upper pad, the semiconductor chip being mounted on the base chip; a bump disposed on the upper pad, and electrically connecting the base chip and the semiconductor chip; and an adhesive film disposed between the base chip and the semiconductor chip, and fixing the semiconductor chip on the base chip, wherein the adhesive film is configured to fill the groove.

19 Claims, 10 Drawing Sheets

(51) Int. Cl.

| | |
|---|---|
| ***H10W 74/01*** | (2026.01) |
| ***H10W 74/15*** | (2026.01) |
| ***H10W 90/00*** | (2026.01) |
| ***H10W 99/00*** | (2026.01) |

(56) References Cited

U.S. PATENT DOCUMENTS

| | | | | |
|---|---|---|---|---|
| 10,483,224 | B2 | 11/2019 | Jin et al. | |
| 10,497,675 | B2 | 12/2019 | Kwak et al. | |
| 2009/0261460 | A1 | 10/2009 | Kuan et al. | |
| 2016/0086874 | A1 | 3/2016 | Choi et al. | |
| 2018/0374801 | A1 | 12/2018 | Jeng et al. | |
| 2021/0111159 | A1* | 4/2021 | Park | H10W 90/00 |
| 2021/0343689 | A1* | 11/2021 | Park | H01L 24/73 |

FOREIGN PATENT DOCUMENTS

| | | | |
|---|---|---|---|
| KR | 1020190087897 | A | 7/2019 |
| KR | 1020210135052 | A | 11/2021 |

* cited by examiner

【FIG. 1】
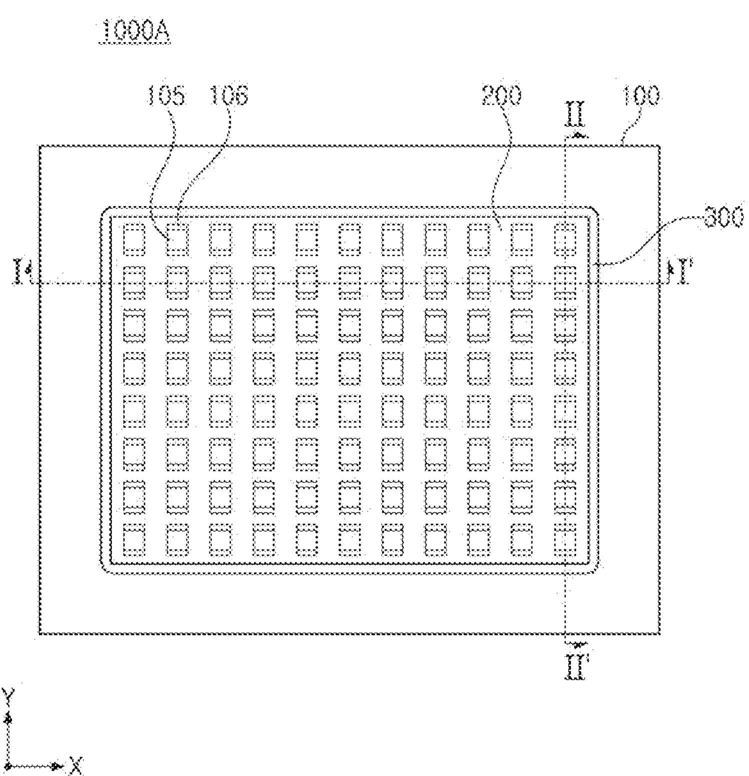

【FIG. 2】
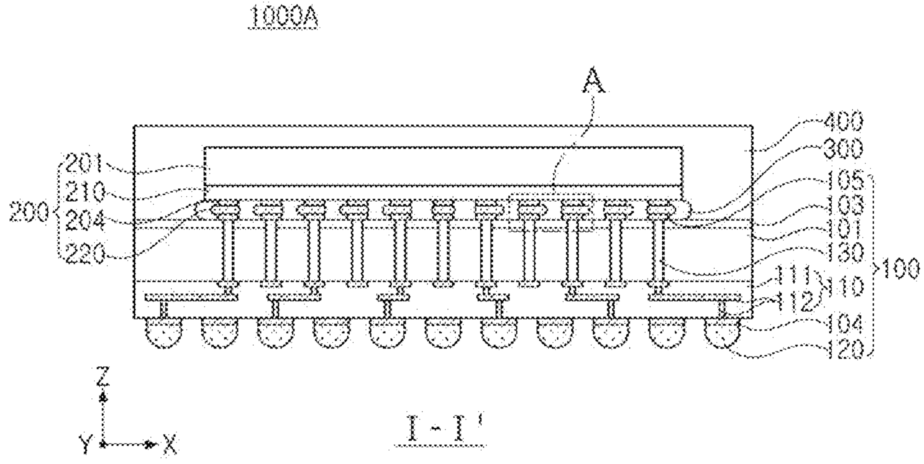
【FIG. 3】
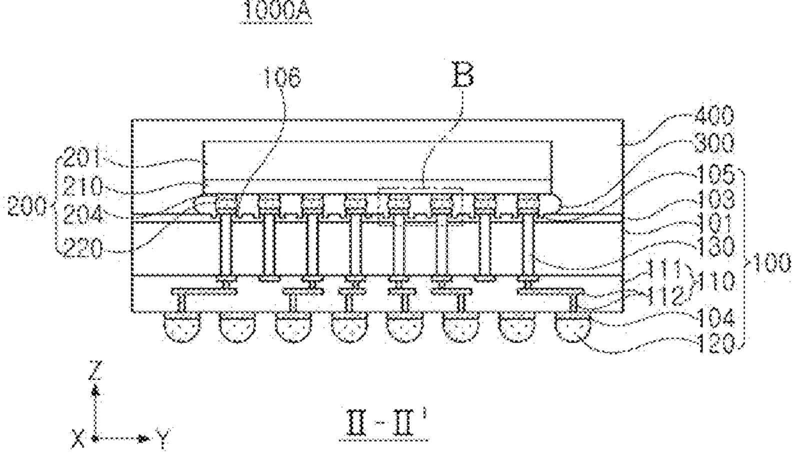

【FIG. 4a】
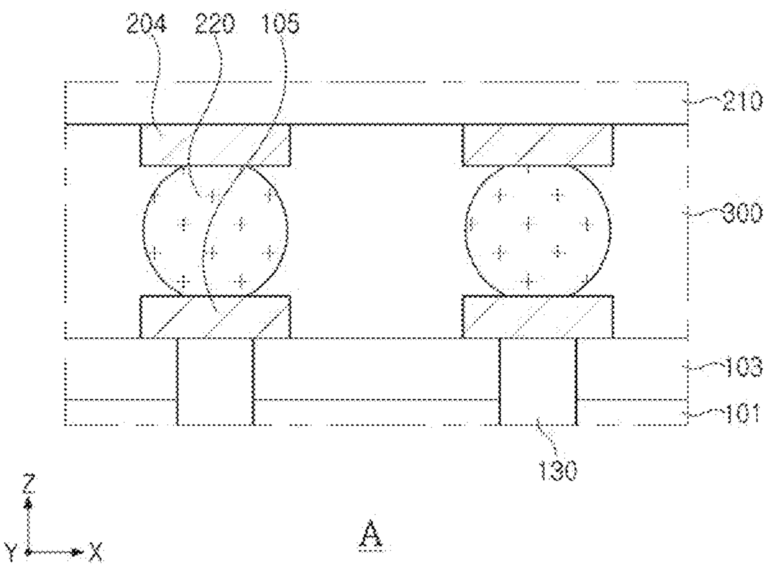
【FIG. 4b】
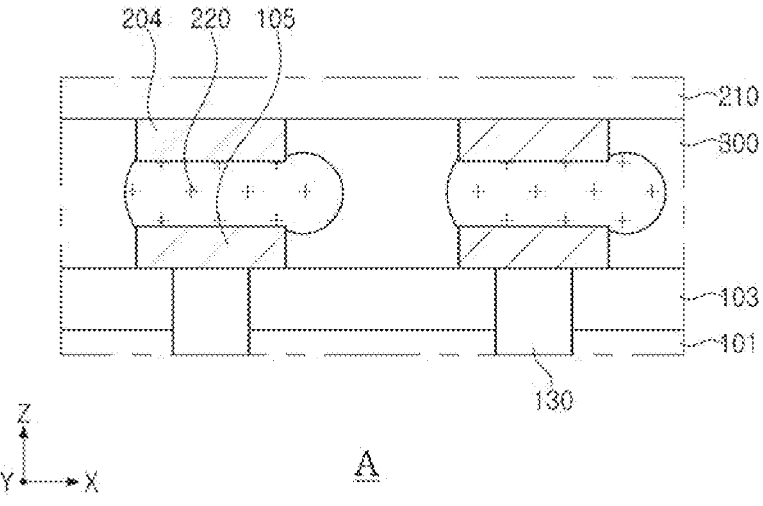

【FIG. 5a】
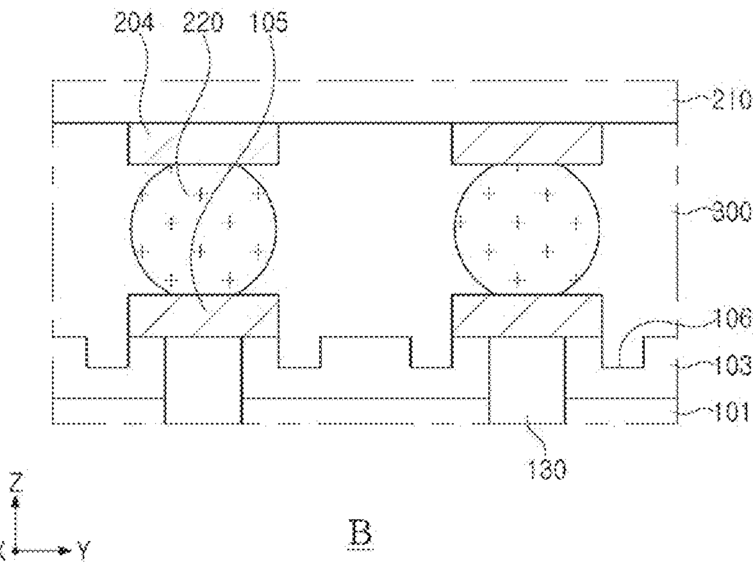
【FIG. 5b】
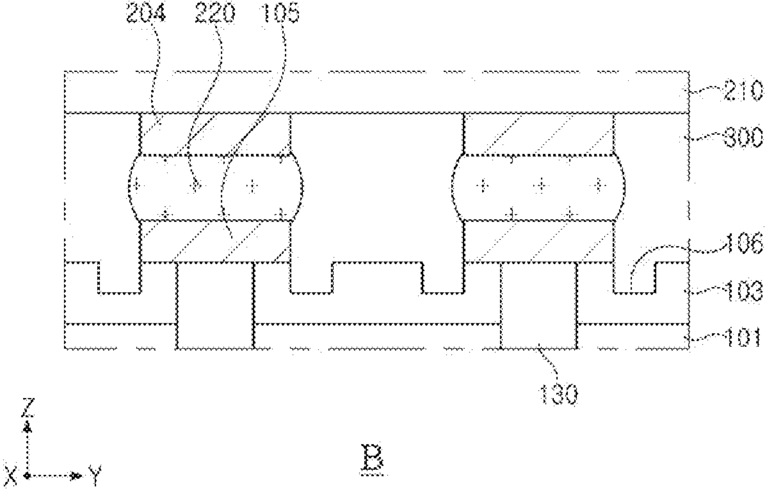

【FIG. 6】
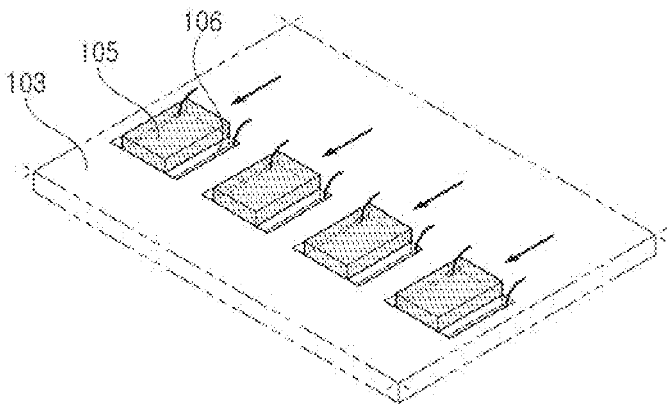
【FIG. 7】
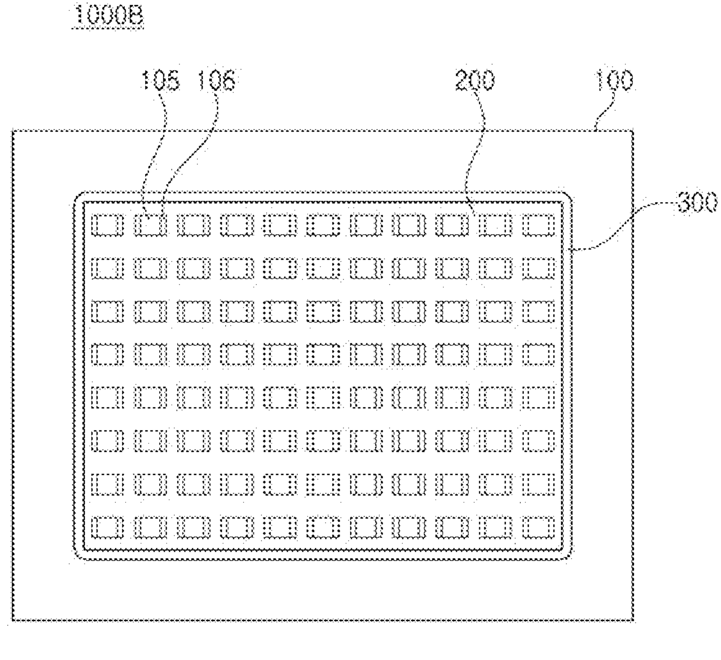

【FIG. 8】
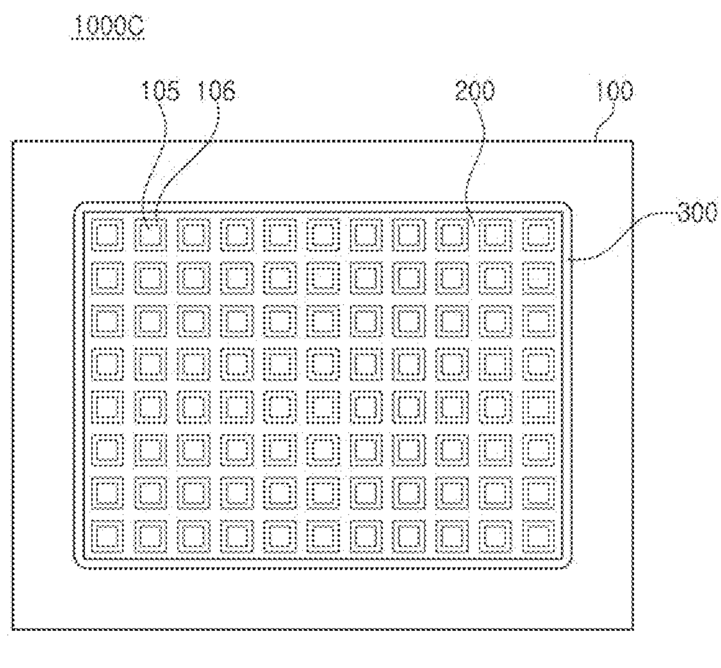

【FIG. 9】
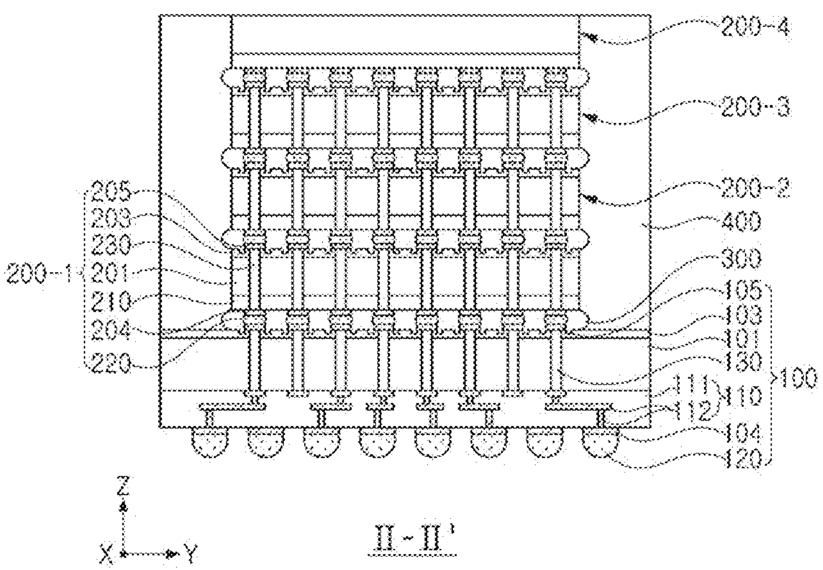
【FIG. 10】
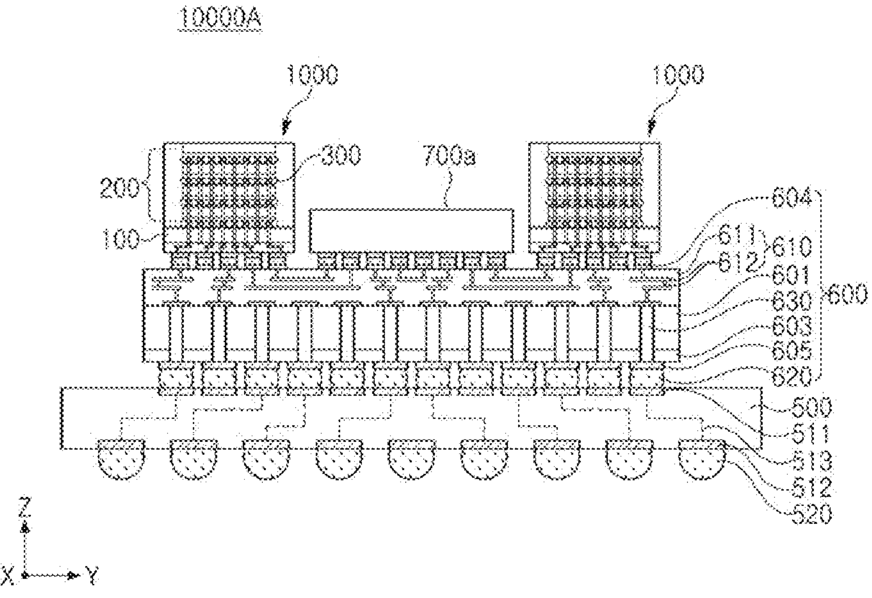

【FIG. 11a】
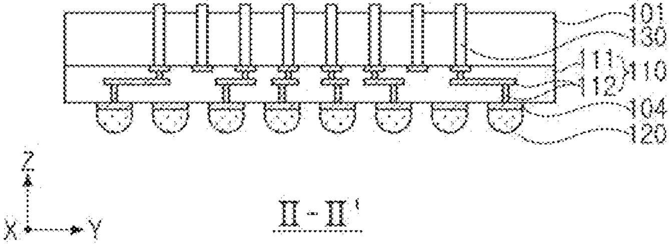
【FIG. 11b】
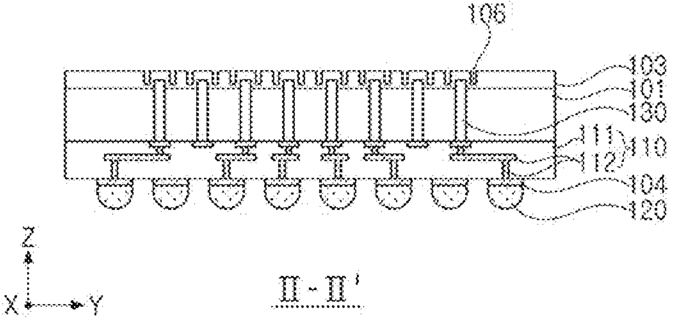
【FIG. 11c】
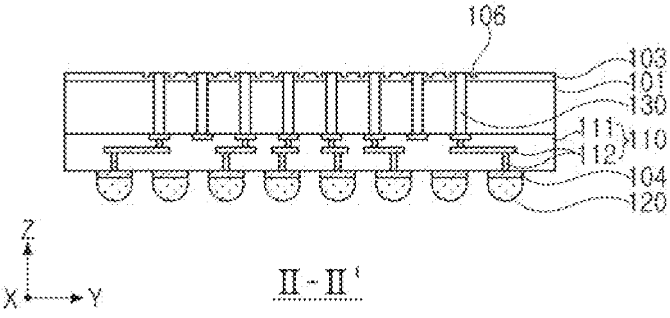

【FIG. 11d】
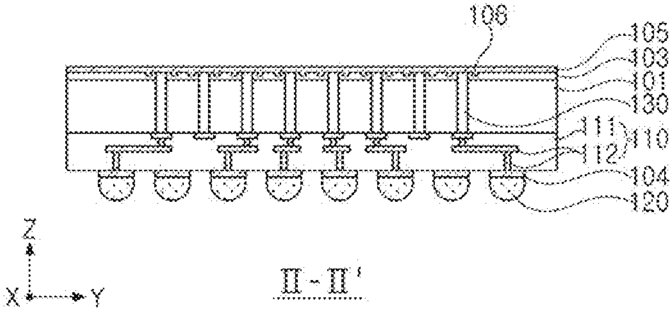
【FIG. 11e】
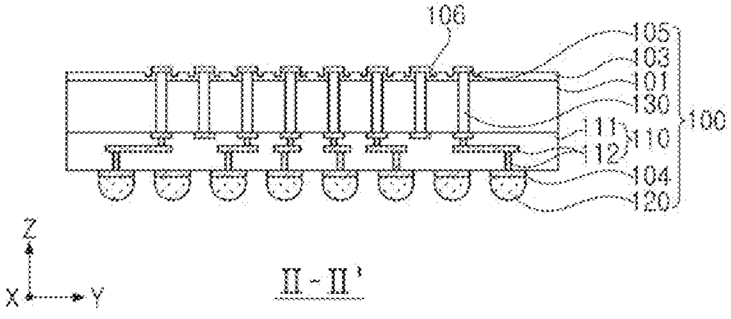
【FIG. 11f】
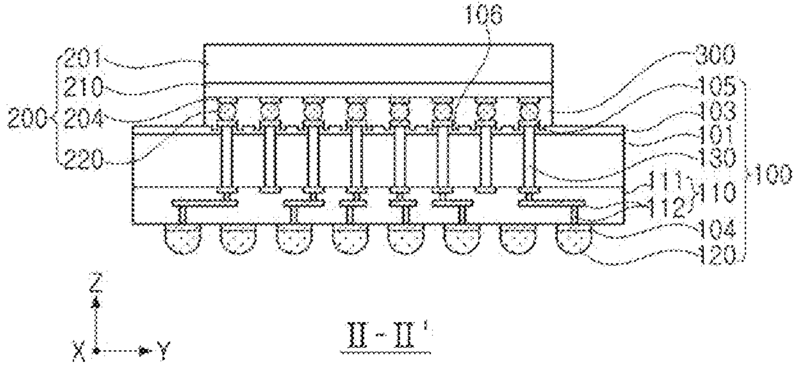

【FIG. 11g】
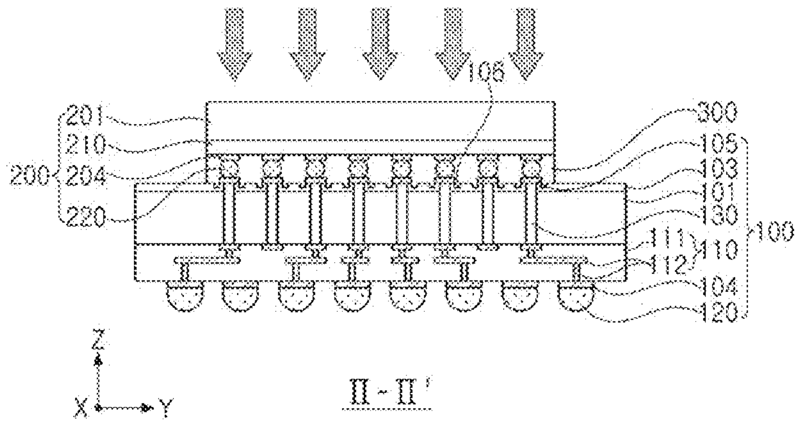
【FIG. 11h】
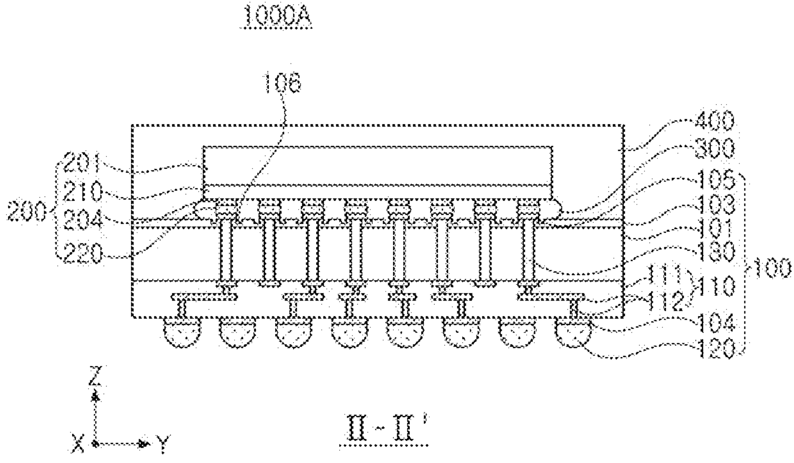

SEMICONDUCTOR PACKAGE

CROSS-REFERENCE TO RELATED APPLICATION

This application claims priority and benefit under 35 U.S.C. § 119 of Korean Patent Application No. 10-2022-0070165, filed on Jun. 9, 2022, with the Korean Intellectual Property Office, the entire disclosure of which is incorporated herein by reference.

BACKGROUND

1. Field

The present inventive concept relates to a semiconductor package.

2. Description of Related Art

According to the implementation of weight reductions and high performance in electronic devices, miniaturization and high performance are also required in the field of semiconductor packages. In order to realize miniaturization, weight reduction, high performance, high capacity, and high reliability of the semiconductor package, research and development of a semiconductor package having a structure in which semiconductor chips are stacked in multiple stages are continuously being conducted.

SUMMARY

An aspect of the present inventive concept is to provide a semiconductor package having improved reliability.

According to an aspect of the present inventive concept, a semiconductor package is provided, the semiconductor package including: a base chip including a substrate, an upper protective layer disposed on the substrate, an upper pad disposed on the upper protective layer, and a groove disposed adjacent to the upper pad and recessed from the upper protective layer; a semiconductor chip including a connection pad disposed on the upper pad, the semiconductor chip being mounted on the base chip; a bump disposed on the upper pad, and electrically connecting the base chip and the semiconductor chip; and an adhesive film disposed between the base chip and the semiconductor chip, and fixing the semiconductor chip on the base chip, wherein the adhesive film is configured to fill the groove.

According to an aspect of the present inventive concept, a semiconductor package is provided, the semiconductor package including: a base chip including a substrate, a first upper protective layer disposed on the substrate, a first upper pad disposed on the first upper protective layer, and a first groove disposed adjacent to the first upper pad and recessed from the first upper protective layer; a first semiconductor chip including a first connection pad disposed on the first upper pad, a second upper protective layer disposed on the first connection pad, a second upper pad disposed on the second upper protective layer, and a second groove disposed adjacent to the second upper pad and recessed from the second upper protective layer, the first semiconductor chip being mounted on the base chip; a second semiconductor chip including a second connection pad disposed on the first semiconductor chip, the second semiconductor chip being mounted on the first semiconductor chip; a first bump disposed on the first upper pad, and electrically connecting the base chip and the first semiconductor chip; a second bump disposed on the second upper pad, and electrically connecting the first semiconductor chip and the second semiconductor chip; and an adhesive film disposed between the base chip and the first semiconductor chip and between the first semiconductor chip and the second semiconductor chip, wherein the adhesive film is configured to fill the first and second grooves.

According to an aspect of the present inventive concept, a semiconductor package is provided, the semiconductor package including: a package substrate; an interposer substrate disposed on the package substrate; and at least one chip structure disposed on the interposer substrate, wherein the at least one chip structure includes a base chip, a plurality of semiconductor chips disposed on the base chip, a bump electrically connecting the base chip and the plurality of semiconductor chips, and an adhesive film disposed between the base chip and the plurality of semiconductor chips, the base chip includes a substrate, an upper protective layer disposed on the substrate, an upper pad disposed on the upper protective layer, and a groove disposed adjacent to the upper pad and recessed from the upper protective layer, the groove extends lengthwise in a first direction adjacent to the upper pad, and the bump is left-right asymmetrical in a cross-section in the first direction.

BRIEF DESCRIPTION OF DRAWINGS

The above and other aspects, features, and advantages of the present inventive concept will be more clearly understood from the following detailed description taken in conjunction with the accompanying drawings, in which like numbers refer to like elements throughout. In the drawings:

FIG. 1 is a plan view illustrating a semiconductor package according to an example embodiment of the present inventive concept.

FIG. 2 is a cross-sectional view illustrating a semiconductor package according to an example embodiment of the present inventive concept.

FIG. 3 is a cross-sectional view illustrating a semiconductor package according to an example embodiment of the present inventive concept.

FIGS. 4A and 4B are partially enlarged views illustrating a change in a shape according to a manufacturing process of a semiconductor package according to an example embodiment of the present inventive concept.

FIGS. 5A and 5B are partially enlarged views illustrating a change in a shape according to a manufacturing process of a semiconductor package according to an example embodiment of the present inventive concept.

FIG. 6 is a perspective view illustrating a portion of a manufacturing process of a semiconductor package according to an example embodiment of the present inventive concept.

FIG. 7 is a plan view illustrating a semiconductor package according to an example embodiment of the present inventive concept.

FIG. 8 is a plan view illustrating a semiconductor package according to an example embodiment of the present inventive concept.

FIG. 9 is a cross-sectional view illustrating a semiconductor package according to an example embodiment of the present inventive concept.

FIG. 10 is a cross-sectional view illustrating a semiconductor package according to an example embodiment of the present inventive concept.

FIGS. 11A to 11H are cross-sectional views to illustrate a manufacturing process of a semiconductor package according to an example embodiment of the present inventive concept according to a process sequence.

DETAILED DESCRIPTION

Hereinafter, example embodiments of the present inventive concept will be described with reference to the accompanying drawings as follows.

FIG. 1 is a plan view illustrating a semiconductor package 1000A according to an example embodiment of the present inventive concept, FIG. 2 is a cross-sectional view illustrating a cross-section taken along line I-I' of FIG. 1, and FIG. 3 is a cross-sectional view taken along the line II-II' of FIG. 1.

Referring to FIGS. 1 to 3, the semiconductor package 1000A of the present example embodiment may include a base chip 100, a semiconductor chip 200, and an adhesive film 300. In addition, the semiconductor package 1000A of the present example embodiment may further include an encapsulant 400 encapsulating the semiconductor chip 200.

In example embodiments, the base chip 100 may include a semiconductor material such as a silicon (Si) wafer. In other example embodiments, the base chip 100 may be a PCB or a glass substrate that does not include a semiconductor material. The base chip 100 may include a substrate 101, an upper protective layer 103, an upper pad 105, a lower pad 104, a groove 106, a device layer 110, an external connection terminal 120, and a through silicon via (TSV) 130. In embodiments, the upper pad 105 may be a plurality of upper pads 105, the lower pad 104 may be a plurality of lower pads 104, the groove 106 may be a plurality of grooves 106, the external connection terminal 120 may be a plurality of external connection terminals 120, and the TSV 130 may be a plurality of TSVs 130. However, when the base chip 100 is a PCB or a glass substrate that does not include a semiconductor material, the base chip 100 may not include a device layer and a TSV.

The base chip 100 may be, for example, a buffer chip including a plurality of logic devices and/or memory devices in the device layer 110. Accordingly, the base chip 100 may transmit signals from the semiconductor chip 200 stacked thereon externally, and may also transmit signals and power from the outside to the semiconductor chip 200. The base chip 100 may perform both a logic function and a memory function through logic devices and memory devices, but according to an example embodiment, the base chip 100 may only include a logic device to perform a logic function.

The substrate 101 may include, for example, a semiconductor device such as silicon or germanium (Ge), or include a compound semiconductor such as silicon carbide (SiC), gallium arsenide (GaAs), indium arsenide (InAs), or indium phosphide (InP). The substrate 101 may have a silicon on insulator (SOI) structure. The substrate 101 may include a conductive region, for example, a well doped with an impurity or a structure doped with an impurity. The substrate 101 may include various device isolation structures such as a shallow trench isolation (STI) structure.

The upper protective layer 103 may be formed on an upper surface of the substrate 101, and may protect the substrate 101. In example embodiments, a lower surface of the upper protective layer 103 may contact an upper surface of the substrate 101. The upper protective layer 103 may be formed of an insulating layer such as a silicon oxide film, a silicon nitride film, or a silicon oxynitride film, but a material of the upper protective layer 103 is not limited to the materials. For example, the upper protective layer 103 may also be formed of a polymer such as Polyimide (PI). Although not shown in the drawings, a lower protective layer may be further formed on a lower surface of the device layer 110. The upper protective layer 103 may include a first layer, a second layer disposed on the first layer, and a third layer disposed on the second layer. The second layer may include a material, different from that of the first and third layers, and for example, the first and third layers may include silicon oxide, and the second layer may include silicon nitride. The first and second layers may have a thickness in a range of about 0.5 μm to about 1 μm, and the third layer may have a thickness in a range of about 1 un to about 3 un.

The upper pads 105 may be disposed on the upper protective layer 103. Lower surfaces of the upper pads 105 may contact an upper surface of the upper protective layer 103. The upper pad 105 may include, for example, at least one of aluminum (Al), copper (Cu), nickel (Ni), tungsten (W), platinum (Pt), and gold (Au). The lower pads 104 may be disposed below the device layer 110. Upper surfaces of the lower pads 104 may contact a lower surface of the device layer 110. The lower pads 104 may include a material, similar to that of the upper pad 105. For example, the lower pads 104 may include at least one of aluminum (Al), copper (Cu), nickel (Ni), tungsten (W), platinum (Pt), and gold (Au). However, a material of the upper pads 105 and the lower pads 104 is not limited to the above materials.

The grooves 106 may be disposed adjacent to both sides of the upper pads 105 in a Y-direction, and may be a region in which the upper protective layer 103 is recessed. For example, side surface of the upper pads 105 may be coplanar with side surfaces of the grooves 106 adjacent to the upper pads 105.

The grooves 106 may have a depth corresponding to a thickness of the third layer, and for example, may have a depth in a range of about 1 μm to about 3 μm. According to an example embodiment, the grooves 106 may have a depth corresponding to a sum of the thicknesses of the first to third layers, for example, may have a depth in a range of about 2 μm to about 5 μm. A ratio of a width of the upper pad 105 to the groove 106 may be about 17 to 1, and each of the grooves 106 may have a width in a range of about 1 μm to about 6.5 μm. The grooves 106 may extend around the upper pad 105 in a X-direction, and the width of each of the grooves 106 in the X-direction may be in a range of about 5 μm to about 50 μm. The width of the groove 106 in the Y-direction may be in a range of about 3% to about 10% of the width of the upper pad 105 in the Y-direction, for example, may be in a range of about 1 μm to about 6.5 μm. In example embodiments, a distance between grooves 106 provided on opposite sides of an upper pad 105 in the Y-direction may be substantially the same as the width of the upper pad 105 in the Y-direction.

The device layer 110 may be disposed on a lower surface of the substrate 101, and may include various types of devices. For example, the device layer 110 may include FET such as a planar field effect transistor (FET) or a FinFET, memory devices such as a flash memory, a dynamic random access memory (DRAM), a static random access memory (SRAM), an electrically erasable programmable read-only memory (EEPROM), a phase-change random access memory (PRAM), a magnetoresistive random access memory (MRAM), a ferroelectric random access memory (FeRAM), a resistive random access memory (RRAM), and the like, logic devices such as AND, OR, NOT, and the like, and various active and/or passive devices such as a system large scale integration (LSI), a CMOS Imaging Sensor (CIS), and a micro-electro-mechanical system (MEMS).

The device layer 110 may include an interlayer insulating layer 111 and a multilayer interconnection wiring layer 112 on the above-described devices. The interlayer insulating layer 111 may include silicon oxide or silicon nitride. The multilayer interconnection wiring layer 112 may include multilayer interconnections and/or vertical contacts. The multilayer interconnection wiring layer 112 may connect devices of the device layer 110 to each other, devices to a conductive region of the substrate 101, or devices to the external connection terminals 120.

The external connection terminals 120 may be disposed on the lower pads 104, and may be connected to the multilayer interconnection wiring layer 112 inside the device layer 110 or the TSV 130. Each of the external connection terminals 120 may be formed of a solder ball. However, according to an example embodiment, the external connection terminals 120 may also have a structure including a pillar and a solder. The semiconductor package 1000A may be mounted on an external substrate such as an interposer or a package substrate through the external connection terminals 120.

The through silicon vias (TSVs) 130 may penetrate through the substrate 101 in a vertical direction (Z direction), and provide an electrical path connecting the upper pads 105 and the lower pads 104. In example embodiments, a height in the third direction D3 of each of the TSVs 130 may be greater than a thickness in the third direction D3 of the substrate 101. For example, a lower surface of each of the TSVs 130 may be coplanar with a lower surface of the substrate 101, and an upper surface of each of the TSVs 130 may be at a higher level in the third direction D3 than the upper surface of the substrate 101. Each of the TSVs 130 may include a conductive plug and a barrier film surrounding the same. The conductive plug may include a metal material, for example, tungsten (W), titanium (Ti), aluminum (Al), or copper (Cu). The conductive plug may be formed by a plating process, a PVD process, or a CVD process. The barrier film may include an insulating barrier film and/or a conductive barrier film. The insulating barrier film may be formed of an oxide film, a nitride film, a carbide film, a polymer, or a combination thereof. The conductive barrier film may be disposed between the insulating barrier film and the conductive plug. The conductive barrier film may include, for example, a metal compound such as tungsten nitride (WN), titanium nitride (TiN), or tantalum nitride (TaN). The barrier film may be formed by a PVD process or a CVD process.

The semiconductor chip 200 may be stacked on the base chip 100, and may include a substrate 201, a device layer 210, and bumps 220. In the drawing, one semiconductor chip 200 is illustrated, but in example embodiments of the present inventive concept, the number of semiconductor chip 200 is not limited thereto. For example, two or more semiconductor chips 200 may be stacked on the base chip 100. The substrate 201 may have characteristics substantially the same as those described for the substrate 101 of the base chip 100.

The device layer 210 may include a plurality of memory devices. For example, the device layer 210 may include volatile memory devices such as DRAM and SRAM, or non-volatile memory devices such as PRAM, MRAM, FeRAM, or RRAM. For example, in the semiconductor package 1000A of the present example embodiment, the semiconductor chip 200 may include DRAM devices in the device layer 210. Accordingly, the semiconductor package 1000A of the present example embodiment may be used for a high bandwidth memory (HBM) product, an electro data processing (EDP) product, or the like.

The device layer 210 may include a multilayer wiring layer therebelow. The multilayer wiring layer may have characteristics similar to those described for the multilayer interconnection wiring layer 112 of the device layer 110 in the base chip 100. Therefore, devices of the device layer 210 may be electrically connected to the bump 220 through the multilayer wiring layer. In an example, the base chip 100 may include a plurality of logic devices and/or memory devices in the device layer 110, and may be referred to as a buffer chip, a control chip, or the like according to its function, whereas the semiconductor chip 200 may include a plurality of memory devices in the device layer 210, and may be referred to as a core chip.

Each of the bumps 220 may be disposed on a corresponding connection pad 204 on a lower surface of the device layer 210, and may be connected to devices of the device layer 210 through interconnections of the multilayer wiring layer. The bumps 220 may electrically connect the semiconductor chip 200 and the base chip 100. Each of the bumps 220 may include, for example, a solder, but according to an example embodiment, may include both a pillar and a solder. The pillar may have a polygonal column shape such as a cylindrical column, or a square column or an octagonal column, and may include, for example, nickel (Ni), copper (Cu), palladium (Pd), platinum (Pt), gold (Au), or a combination thereof. The solder may have a spherical or ball shape, for example, and may include tin (Sn), indium (In), bismuth (Bi), antimony (Sb), copper (Cu), silver (Ag), zinc (Zn), lead (Pb) and/or an alloy thereof. The alloy may include, for example, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, and the like. The bumps 220 may have a left-right asymmetrical shape, in a cross-section in the X-direction, for example, may have an asymmetrical shape protruding toward an edge of the substrate 101 adjacent to the bump in the X-direction.

The adhesive film 300 may be disposed between the base chip 100 and the semiconductor chip 200 to surround side surfaces of the bumps 220, and fix the semiconductor chip 200 to the base chip 100. As illustrated in FIGS. 2 and 3, the adhesive film 300 may protrude outwardly from the side surface of the semiconductor chip 200. The adhesive film 300 may be a non-conductive film (NCF), but an example embodiment thereof is not limited thereto, and may include, for example, any type of polymer film that can perform a pressure-reflow process. The pressure-reflow process may be understood as a process of reflowing the adhesive film 300, by applying heat while maintaining constant pressure in a process chamber. The pressure applied in the pressure-reflow process is a kind of hydrostatic pressure, and a magnitude of the pressure applied to any surface of the semiconductor chip 200 may be constant regardless of the direction. While the pressure-reflow process is in progress, a flow of the adhesive film 300 may occur. In this case, the bump 220 may obstruct the flow of the adhesive film 300. When a pitch of the bumps 220 is reduced, the number of bumps 220 per unit area increases, so a degree of obstruction of the flow of the adhesive film 300 by the bumps 220 may increase. Meanwhile, while the pressure-reflow process is in progress, the bumps 220 may be deformed to spread laterally. As the bumps 220 spread laterally, a distance between the adjacent bumps 220 may become closer, and accordingly, a short defect may occur between the bumps 220. In the semiconductor package 1000A of the present example embodiment, a short circuit defect between the bumps 220 may be prevented, by disposing grooves 106 adjacent to the upper pads 105. When there are grooves 106, the adhesive film 300 flows into the grooves 106 so that the adhesive film 300 flows smoothly. When the flow of the adhesive film 300 is smoothed, compared to the case in which the flow of the adhesive film 300 is not made relatively smooth, the bumps 220 may spread less laterally, and a distance between the bumps 220 may be relatively long. As the distance between the bumps 220 is relatively increased, a short defect between the bumps 220 may be relatively decreased. The adhesive film 300 may fill the grooves 106, and according to the example embodiment, a portion or all of each of the grooves 106 may be filled. As the adhesive film 300 fills the grooves 106, the adhesive film 300 may include a protrusion protruding toward the grooves 106.

The encapsulant 400 may be disposed on the base chip 100, and may cover a portion of an upper surface of the base chip 100 and an upper surface and a side surface of the semiconductor chip 200, and a side surface of the adhesive film 300. As illustrated in FIGS. 2 and 3, the encapsulant 400 may have a predetermined thickness and may cover the upper surface of the semiconductor chip 200. However, according to an example embodiment, the encapsulant 400 may not cover the upper surface of the semiconductor chip 200. In this case, the upper surface of the semiconductor chip 200 may be exposed from the encapsulant 400. The encapsulant 400 may include, for example, an epoxy molding compound (EMC), but a material of the encapsulant 400 is not limited thereto.

FIGS. 4A and 4B are partially enlarged views illustrating a change in a shape according to a manufacturing process of a semiconductor package 1000A according to an example embodiment of the present inventive concept.

FIGS. 4A and 4B are enlarged views of a region corresponding to region 'A' of FIG. 2, and are diagrams illustrating a change in a shape of the bumps 220 according to a progress of a pressure-reflow process. Referring to FIG. 4A, before the pressure-reflow process is performed, the bumps 220 may have a circular shape or an elliptical shape. Referring to FIG. 4B, after the pressure-reflow process is performed, the bumps 220 may have a shape protruding externally beyond side surfaces of the upper pads 105 and the connection pads 204. As a flow of the adhesive film 300 proceeds in an X-direction, the bumps 220 may protrude in the X-direction. In some example embodiments, the protruding direction of the bump 220 may vary according to a flow direction of the adhesive film 300. For example, when the flow of the adhesive film 300 proceeds in a Y-direction, the bumps 220 may protrude in the Y-direction. The bumps 220 may have an asymmetrical shape in a cross-section in the X-direction, and a center of gravity of the bumps 220 may be different from a center of gravity of the upper pads 105 in the X-direction. In some example embodiments, an asymmetrical direction of the bumps 220 may vary according to the flow direction of the adhesive film 300. For example, when the flow of the adhesive film 300 proceeds in the Y-direction, the bumps 220 may have an asymmetrical shape in a cross-section in the Y-direction, and the center of gravity of the bumps 220 may be different from the center of gravity of the upper pads 105 in the Y-direction.

FIGS. 5A and 5B are partially enlarged views illustrating a change in a shape according to a manufacturing process of a semiconductor package 1000A according to an example embodiment of the present inventive concept.

FIGS. 5A and 5B are enlarged views of a region corresponding to area 'B' of FIG. 3, and are views illustrating a change in the shape of the bumps 220 according to a progress of a pressure-reflow process. Referring to FIG. 5A, before the pressure-reflow process is performed, the bumps 220 may have a circular shape or an elliptical shape. Referring to FIG. 5B, after the pressure-reflow process is performed, the bumps 220 may have a shape spread in a Y-direction. As a flow of the adhesive film 300 proceeds in an X-direction, the bumps 220 may have a symmetrical shape with respect to the Y-direction. In some example embodiments, a symmetrical direction of the bumps 220 may vary according to a flow direction of the adhesive film 300. For example, when the flow of the adhesive film 300 proceeds in the Y-direction, the bumps 220 may have a symmetrical shape with respect to the X-direction.

FIG. 6 is a perspective view illustrating a portion of a manufacturing process of a semiconductor package according to an example embodiment of the present inventive concept.

Arrows illustrated in FIG. 6 indicate a flow of an adhesive film. As a pressure-reflow process proceeds, a flow of the adhesive film may occur. When there is a groove 106 adjacent to an upper pad 105, the flow of the adhesive film may occur not only in a direction toward the upper pad 105, but also in a direction toward the groove 106. Accordingly, when there is a groove 106, the flow of the adhesive film can be performed smoothly.

FIG. 7 is a plan view illustrating a semiconductor package 1000B according to an example embodiment of the present inventive concept.

Referring to FIG. 7, in the semiconductor package 1000B of the present example embodiment, a groove 106 may be disposed adjacent to an upper pad 105 in an X-direction. When the groove 106 is disposed adjacent to the upper pad 105 in the X-direction, a bump 220 sweep may occur in the Y-direction. For example, when the grooves 106 are disposed adjacent to the upper pads 105 in the X-direction, each of the bumps 220 may have a protrusion protruding in the Y-direction. Although not illustrated, when the bump 220 sweep occurs in the Y-direction, compared to the case in which the bump 220 sweep does not occur, the shape of the bump 220 may be relatively more spread in the Y-direction, and may spread less in the X-direction. A center of gravity of the bumps 220 may be different from a center of gravity of the upper pads 105 in the Y-direction.

FIG. 8 is a plan view illustrating a semiconductor package 1000C according to an example embodiment of the present inventive concept.

Referring to FIG. 8, in the semiconductor package 1000C of the present example embodiment, a groove 106 may be disposed adjacent to an upper pad 105 in X and Y-directions, and may surround the upper pad 105. When the groove 106 is disposed adjacent to the upper pad 105 in the X and Y-directions, a bump 220 sweep may occur in the X and Y-directions. For example, when the grooves 106 are disposed adjacent to the upper pads 105 in the X and Y-directions, each of the bumps 220 may have a protrusion protruding in the X and Y-directions. According to an example embodiment, a width of the groove 106 in the X-direction and a width of the groove 106 in the Y-direction may be different, and the width of the groove 106 may be set in a direction to optimize the bump 220 sweep.

FIG. 9 is a cross-sectional view illustrating a semiconductor package 1000D according to an example embodiment of the present inventive concept.

Referring to FIG. 9, it may be understood that the semiconductor package 1000D according to the present example embodiment has the same characteristics as the semiconductor package 1000A illustrated in FIGS. 1 to 3, except that a plurality of semiconductor chips 200-1, 200-2, 200-3, and 200-4 are stacked on the base chip 100. Accordingly, descriptions overlapping with those described with reference to FIGS. 1 to 3 will be omitted.

In the semiconductor package 1000D according to the present example embodiment, for example, first to fourth semiconductor chips 200-1, 200-2, 200-3, and 200-4 may be stacked on the base chip 100, and the first to fourth semiconductor chips 200-1, 200-2, 200-3, and 200-4 may be electrically connected to each other through TSVs 230 provided in the first to third semiconductor chips 200-1, 200-2, and 200-3. In an example, the number of the semiconductor chips 200 stacked on the base chip 100 may be two, three, or five or more.

Each of the first to fourth semiconductor chips 200-1, 200-2, 200-3, and 200-4 may include a memory chip, similar to the semiconductor chip 200 described with reference to FIGS. 1 to 3. However, each of the first to third semiconductor chips 200-1, 200-2, and 200-3 may include an upper protective layer 203 and upper pads 205 on an upper surface of a substrate 201, and TSVs 230 penetrating through the substrate 201, whereas the fourth semiconductor chip 200-4 may not include the upper protective layer 203, the upper pads 205, and the TSVs 230. An encapsulant 400 may cover side surfaces of the first to fourth semiconductor chips 200-1, 200-2, 200-3, and 200-4. An upper surface of the fourth semiconductor chip 200-4 may not be covered by the encapsulant 400, but in an example, the upper surface of the fourth semiconductor chip 200-4 may be covered by the encapsulant 400.

The first semiconductor chip 200-1 may be stacked on the base chip 100 through bumps 220 and an adhesive film 300*b*. Each of the second to fourth semiconductor chips 200-2, 200-3, and 200-4 may be stacked on the corresponding semiconductor chip through the bumps 220 and the adhesive film 300*b*. Specifically, the second semiconductor chip 200-2 may be stacked on the first semiconductor chip 200-1, the third semiconductor chip 200-3 may be stacked on the second semiconductor chip 200-2, and the fourth semiconductor chip 200-4 may be stacked on the third semiconductor chip 200-3 through the bumps 220 and the adhesive film 300*b*.

FIG. 10 is a cross-sectional view illustrating a semiconductor package 10000A according to an example embodiment of the present inventive concept.

Referring to FIG. 10, the semiconductor package 10000A of the present example embodiment may include a package substrate 500, an interposer substrate 600, and at least one chip structure 1000. In addition, the semiconductor package 10000A may further include a logic chip or a processor chip 700*a* disposed adjacent to the chip structure 1000 on the interposer substrate 600.

The package substrate 500 may include lower pads 512 disposed on a lower surface of package substrate 500, an upper pads 511 disposed on an upper surface of the package substrate 500, and a redistribution circuit 513 electrically connecting the lower pads 512 and the upper pads 511. In example embodiments, lower surfaces of the lower pads 512 may be coplanar with the lower surface of package substrate 500, and upper surfaces of the upper pads 511 may be coplanar with the upper surface of package substrate 500. The package substrate 500 is a support substrate on which the interposer substrate 600, the processor chip 700*a*, and the chip structure 1000 are mounted, and may be a substrate for a semiconductor package including a printed circuit board (PCB), a ceramic substrate, a glass substrate, a tape wiring board, and the like. The body of the package substrate 500 may include different materials depending on the type of the substrate. For example, when the package substrate 500 is a printed circuit board, it may be in a form in which an interconnection layer is additionally laminated on one side or both sides of a body copper clad laminate or a copper clad laminate. A solder resist layer may be formed on a lower surface and an upper surface of the package substrate 500, respectively. The lower and upper pads 512 and 511 and the redistribution circuit 513 may form an electrical path connecting the lower surface and the upper surface of the package substrate 500. The lower and upper pads 512 and 511 and the redistribution circuit 513 may be formed of a metallic material, for example, at least one material of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C) or an alloy including two or more metals thereof. The redistribution circuit 513 may include multiple redistribution layers and vias connecting the same. External connection terminals 520 connected to the lower pads 512 may be disposed on a lower surface of the package substrate 500. Each of the external connection terminals 520 may include tin (Sn), indium (In), bismuth (Bi), antimony (Sb), copper (Cu), silver (Ag), zinc (Zn), lead (Pb), and/or alloys thereof.

The interposer substrate 600 may include a substrate 601, a lower protective layer 603, upper pads 604, lower pads 605, an interconnection layer 610, bumps 620, and through electrodes 630. The chip structure 100) and a processor chip 700*a* may be stacked on the package substrate 500 via the interposer substrate 600. The interposer substrate 600 may electrically connect the chip structure 1000 and the processor chip 700*a* to each other.

The substrate 601 may be formed of, for example, any one of silicon, an organic material, plastic, and a glass substrate. When the substrate 601 is a silicon substrate, the interposer substrate 600 may be referred to as a silicon interposer. In addition, when the substrate 601 is an organic substrate, the interposer substrate 600 may be referred to as a panel interposer.

A lower protective layer 603 may be disposed on a lower surface of the substrate 601, and the lower pads 605 may be disposed on a lower surface of the lower protective layer 603. The lower pads 605 may be connected to the through electrodes 630. For example, upper surfaces of the lower pads 605 may contact lower surfaces of the through electrodes 630. The chip structure 1000 and the processor chip 700*a* may be electrically connected to the package substrate 500 through bumps 620 disposed on the lower pads 605.

The interconnection layer 610 may be disposed on an upper surface of the substrate 601, and may include an interlayer insulating layer 611 and a single-layer or multi-layer interconnection structure 612. When the interconnection layer 610 has a multilayer interconnection structure, interconnections of different layers may be connected to each other through vertical contacts.

Lower surfaces of the upper pads 604 may contact an upper surface of the interlayer insulating layer 611. External connection terminals 120 may contact the upper pads 604, electrically connecting the at least one chip structure 1000 to the interposer substrate 600.

The through electrodes 630 may extend from the upper surface to the lower surface of the substrate 601 to penetrate through the substrate 601. In addition, the through electrodes 630 may extend inwardly of the interconnection layer 610, and be electrically connected to the interconnections of the interconnection layer 610. When the substrate 601 is silicon, the through electrodes 630 may be referred to as a TSV. Other structures and materials of the through electrodes 630 are the same as those described for the TSVs 130 of the semiconductor package 1000A of FIGS. 1 to 3. According to an example embodiment, the interposer substrate 600 may include only an interconnection layer therein, but may not include a through electrode.

The interposer substrate 600 may be used for the purpose of converting or transferring an input electrical signal between the package substrate 500 and the chip structure 1000 or the processor chip 700*a*. Accordingly, the interposer substrate 600 may not include devices such as active devices or passive devices. In addition, according to an example embodiment, the interconnection layer 610 may also be disposed below the through electrode 630. For example, a positional relationship between the interconnection layer 610 and the through electrode 630 may be relative.

The bumps 620 may be disposed on a lower surface of the interposer substrate 600 and may be electrically connected to an interconnection of the interconnection layer 610. The interposer substrate 600 may be stacked on the package substrate 500 through the bumps 620. The bumps 620 may be connected to the lower pads 605 through the interconnections of the interconnection layer 610 and the through electrodes 630. In an example, lower pads 605 used for power or ground among the lower pads 605 may be integrated and connected to the bumps 620, so that the number of the lower pads 605 may be greater than the number of the bumps 620.

The logic chip or the processor chip 700*a* may include, for example, a central processor (CPU), a graphics processor (GPU), a field programmable gate array (FPGA), a digital signal processor (DSP), a cryptographic processor, a microprocessor, a microcontroller, an analog-to-digital converter, an application-specific IC (ASIC), and the like. According to the types of devices included in the processor chip 700*a*, the semiconductor package 10000 may be classified into a server-oriented semiconductor package or a mobile-oriented semiconductor package.

The chip structure 1000 may have characteristics similar to those of the semiconductor packages 1000A, 1000B, 1000C, and 1000D described with reference to FIGS. 1 to 9. In example embodiments, each chip structure 1000 may be one of the semiconductor packages 1000A, 1000B, 1000C, and 1000D. For example, the chip structure 1000 may include a base chip 100, a plurality of semiconductor chips 200 stacked on the base chip 100 in a vertical direction (Z-axis direction), and an adhesive film 300 disposed between the base chip 100 and the plurality of semiconductor chips 200, and the base chip 100 and the plurality of semiconductor chips 200 may be disposed adjacent to a pad, and may include a groove in which the upper protective layer is recessed. The groove may be disposed adjacent to the pad in the Y-direction, and recess the upper protective layer.

The semiconductor package 1000A of the present example embodiment may further include an inner encapsulant covering a side surface and an upper surface of the chip structure 1000 and the processor chip 700*a* on the interposer substrate 600. In addition, the semiconductor package 10000A may further include an outer encapsulant covering the interposer substrate 600 and the inner encapsulant on the package substrate 500. According to an example embodiment, the outer encapsulant and the inner encapsulant may be formed together and thus may not be distinguished. In addition, according to an example embodiment, the inner encapsulant may cover only the upper surface of the processor chip 700*a*, but not the upper surface of the chip structure 1000.

Meanwhile, in the semiconductor package 10000A of the present example embodiment, the chip structure 1000 and the processor chip 700*a* may be attached to a wide interposer disk through a pressure-reflow process, and then, as an individualization process for the interposer disk is performed, a structure in which the chip structure 1000 and the processor chip 700*a* are mounted on the interposer substrate 600 may be implemented.

FIGS. 11A to 11H are cross-sectional views illustrating a manufacturing process of the semiconductor package 1000A according to an example embodiment of the present inventive concept.

Referring to FIG. 11A, first, a portion of a base chip 100 on which an external connection terminal 120, lower pads 104, device layer 110, a substrate 101, and TSVs 130 are formed is prepared. In this case, an upper portion of each of the TSVs 130 may be exposed externally, and to this end, a portion of the substrate 101 may be removed through a polishing process and an etching process.

Referring to FIG. 11B, an upper protective layer 103 and grooves 106 may be formed. First, an upper protective layer 103 may be formed by depositing silicon nitride or silicon oxide using atomic layer deposition (ALD) or chemical vapor deposition (CVD). The upper protective layer 103 may include first to third layers. A first layer may be formed by depositing silicon oxide, a second layer may be formed by depositing silicon nitride on the first layer, and a third layer may be formed by depositing silicon oxide on the second layer. Next, grooves 106 may be formed by removing a portion of the upper protective layer 103 through a photolithography process and an etching process. In this case, only a portion of the third layer of the upper protective layer 103 may be removed, and in some example embodiments, portions of the second layer and the first layer of the upper protective layer 103 may also be removed.

Referring to FIG. 11C, a thickness of the upper protective layer 103 may be reduced. For example, a portion of the upper protective layer 103 may be removed by a polishing process such as a grinding process. Accordingly, a depth of the grooves 106 may also be relatively shallow.

Referring to FIG. 1I D, a conductive material may be deposited to form the upper pad 105. The conductive material may be deposited using atomic layer deposition (ALD) or chemical vapor deposition (CVD). The conductive material may include, for example, tungsten (W), copper (Cu), or aluminum (Al), and each of the components may further include a diffusion barrier layer.

Referring to FIG. 11E, a portion of the conductive material may be removed through a polishing process such as a grinding process. Next, the conductive material may be removed through a photolithography process and an etching process in a region, other than the region in which the upper pads 105 are disposed. Accordingly, upper pads 105 and grooves 106 may be formed. In example embodiments, side surface of the upper pads 105 may be coplanar with side surfaces of the grooves 106 adjacent to the upper pads 105.

Referring to FIG. 11F, a base chip 100, a semiconductor chip 200, and an adhesive film 300 are prepared. The semiconductor chip 200 may include a substrate 201, a device layer 210, connection pad 204, and bumps 220. Although not illustrated, a plurality of base chips 100 may be disposed on a wafer, and the semiconductor chip 200 may be aligned with the corresponding base chip 100 through a pick-and-place device to be pre-bonded. For example, the semiconductor chip 200 may be aligned with the base chip 100 so that the bumps 220 of the semiconductor chip 200 are in contact with the corresponding upper pads 105.

Meanwhile, the adhesive film 300 may cover the bumps 220 on a lower surface of the semiconductor chip 200 while maintaining a solid state with low fluidity in a state before a pressure-reflow process. The pick-and-place device may pick up the semiconductor chip 200 with the adhesive film 300 attached thereto and pre-bond the semiconductor chip 200 on the corresponding base chip 100 of the wafer. The adhesive film 300 can fix the semiconductor chip 200 to the corresponding base chip 100 with a certain amount of adhesive force.

For reference, pre-bonding refers to a process of simply placing the semiconductor chip 200 on the corresponding base chip 100 without applying pressure or heat, and fixing the same only with adhesive force of the adhesive film 300 in a solid state, and may be a concept corresponding to a thermo-compression bonding (TCB). In a conventional semiconductor chip stacking process, since TCB is performed after pre-bonding, TCB is also referred to as post-bonding. In a semiconductor package manufacturing method of the present example embodiment, TCB may be included in the pre-bonding process.

Referring to FIG. 11G, after pre-bonding the semiconductor chip 200 on a wafer, a pressure-reflow process is performed. The pressure-reflow process may refer to a process of reflowing the adhesive film 300, by applying heat while maintaining a constant pressure in a process chamber. The pressure may remain the same throughout the press-reflow process, or may change as the process progresses. For example, as a process proceeds to suppress warpage of the semiconductor chip 200, pressure may increase. Meanwhile, the pressure applied in the pressure-reflow process is hydrostatic pressure, and a magnitude of the pressure applied to any surface of the semiconductor chip 200 may be constant regardless of a direction. In the pressure-reflow process, heat may be applied while changing a temperature step by step. For example, a first section is a pre-heating section, which can minimize trapping of the adhesive film 300, for example, NCF in a joint interface. In addition, in the first section, a flow of a low-viscosity section of the NCF may occur. When a pitch of the bumps 220 is reduced, the number of bumps 220 per unit area increases, so a degree of obstruction of a flow of the adhesive film 300 by the bumps 220 may increase. In the semiconductor package 1000A of the present example embodiment, a groove 106 adjacent to each of the upper pads 105 may be disposed to allow the adhesive film 300 to flow smoothly. When there is a groove 106, the adhesive film 300 flows into the groove 106 so that the adhesive film 300 may flow smoothly. A second section is a dwelling section, which is a peak temperature section, where curing of the NCF is started, and wetting of a solder of the bumps 220 may be performed. A third section is a cooling section, and voids in the NCF may be minimized. On the other hand, the cooling section may vary depending on the unique capability of the equipment.

Referring to FIG. 11H, by individualizing each base chip 100 in a wafer, the semiconductor package 1000A of FIGS. 1 to 3 may be manufactured. Meanwhile, an encapsulant 400 may be formed for each of the base chips 100. In addition, the encapsulant 400 may be formed by applying an encapsulant material to all of the semiconductor chips 200 on the wafer and then separating the encapsulant material together with the base chip 100.

Accordingly, the semiconductor package 1000A of FIGS. 1 to 3 may be finally manufactured.

As set forth above, according to example embodiments of the present inventive concept, a semiconductor package having improved reliability may be provided by disposing a groove adjacent to a pad.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In contrast, when an element is referred to as being "directly connected" or "directly coupled" to another element, or as "contacting" or "in contact with" another element, there are no intervening elements present at the point of contact. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present inventive concept as defined by the appended claims.

What is claimed is:

1. A semiconductor package, comprising:

a base chip including a substrate, an upper protective layer disposed on the substrate, an upper pad disposed on the upper protective layer, and a groove disposed adjacent to the upper pad and recessed from the upper protective layer;

a semiconductor chip including a connection pad disposed on the upper pad, and mounted on the base chip;

a bump disposed on the upper pad, and electrically connecting the base chip and the semiconductor chip; and an adhesive film disposed between the base chip and the semiconductor chip, and fixing the semiconductor chip on the base chip, wherein the adhesive film fills the groove, wherein the groove extends lengthwise in a first direction adjacent to the upper pad, and wherein a width of the groove in a second direction, perpendicular to the first direction is in a range of about 3% to about 10% of a width of the upper pad in the second direction.

2. The semiconductor package of claim 1, wherein the groove extends lengthwise in the first direction adjacent to the upper pad, and wherein the bump is left-right asymmetrical in a cross-section in the first direction.

3. The semiconductor package of claim 2, wherein the groove comprises first and second grooves respectively disposed on first and second sides of the upper pad.

4. The semiconductor package of claim 1, wherein the upper protective layer comprises a first layer, a second layer disposed on the first layer, and a third layer disposed on the second layer, and wherein the second layer includes a material different from a material of the first and third layers.

5. The semiconductor package of claim 4, wherein the first and second layers each have a thickness in a range of about 0.5 μm to about 1 μm, and wherein the third layer has a thickness in a range of about 1 μm to about 3 μm.

6. The semiconductor package of claim 4, wherein the groove has a depth that is the same as a thickness of the third layer.

7. The semiconductor package of claim 4, wherein the groove has a depth corresponding to a sum of thicknesses of the first to third layers.

8. The semiconductor package of claim 1, wherein the width of the groove in the second direction is in a range of about 1 μm to about 6.5 μm.

9. The semiconductor package of claim 1, wherein the groove extends lengthwise in the first direction adjacent to the upper pad, and wherein a width of the groove in the first direction is in a range of about 5 μm to about 50 μm.

10. The semiconductor package of claim 1, wherein a depth of the groove is in a range of about 1 μm to about 3 μm.

11. The semiconductor package of claim 1, wherein the groove extends lengthwise in the first direction adjacent to the upper pad, and comprises first and second grooves respectively disposed on first and second sides of the upper pad.

12. The semiconductor package of claim 1, wherein the groove has a structure surrounding the upper pad.

13. The semiconductor package of claim 1, wherein the bump has an asymmetrical shape protruding toward an edge of the substrate that is nearest to the bump in the first direction.

14. A semiconductor package, comprising:

a base chip including a substrate, a first upper protective layer disposed on the substrate, a first upper pad disposed on the first upper protective layer, and a first groove disposed adjacent to the first upper pad and recessed from the first upper protective layer;

a first semiconductor chip including a first connection pad disposed on the first upper pad, a second upper protective layer disposed on the first connection pad, a second upper pad disposed on the second upper protective layer, and a second groove disposed adjacent to the second upper pad and recessed from the second upper protective layer, the first semiconductor chip being mounted on the base chip;

a second semiconductor chip including a second connection pad disposed on the first semiconductor chip, the second semiconductor chip being mounted on the first semiconductor chip;

a first bump disposed on the first upper pad, and electrically connecting the base chip and the first semiconductor chip;

a second bump disposed on the second upper pad, and electrically connecting the first semiconductor chip and the second semiconductor chip; and a first adhesive film disposed between the base chip and the first semiconductor chip and a second adhesive film between the first semiconductor chip and the second semiconductor chip, wherein the first and second adhesive films fill the first and second grooves, respectively.

15. The semiconductor package of claim 14, wherein the first groove extends lengthwise in a first direction adjacent to the first upper pad, wherein the second groove extends lengthwise in the first direction adjacent to the second upper pad, and wherein each of the first and second bumps are left-right asymmetrical in a cross-section in the first direction.

16. A semiconductor package, comprising:

a package substrate;

an interposer substrate disposed on the package substrate; and at least one chip structure disposed on the interposer substrate, wherein the at least one chip structure includes a base chip, a plurality of semiconductor chips disposed on the base chip, a bump electrically connecting the base chip and the plurality of semiconductor chips, and an adhesive film disposed between the base chip and the plurality of semiconductor chips, wherein the base chip includes a substrate, an upper protective layer disposed on the substrate, an upper pad disposed on the upper protective layer, and a groove disposed adjacent to the upper pad and recessed from the upper protective layer, wherein the groove extends lengthwise in a first direction adjacent to the upper pad, and wherein the bump is left-right asymmetrical in a cross-section in the first direction.

17. The semiconductor package of claim 16, wherein the adhesive film fills the groove.

18. The semiconductor package of claim 16, wherein the plurality of semiconductor chips are a plurality of memory chips connected to each other through through silicon vias.

19. The semiconductor package of claim 16, further comprising:

a logic chip disposed on the interposer substrate, wherein the logic chip is electrically connected to the at least one chip structure through the interposer substrate.

* * * * *